US009444400B2

(12) United States Patent
Taghivand et al.

(10) Patent No.: US 9,444,400 B2
(45) Date of Patent: Sep. 13, 2016

(54) SYSTEM AND METHOD FOR DYNAMICALLY BIASING OSCILLATORS FOR OPTIMUM PHASE NOISE

(71) Applicant: QUALCOMM Incorporated, San Diego, CA (US)

(72) Inventors: Mazhareddin Taghivand, Campbell, CA (US); Keplin Victor Johansen, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/666,084

(22) Filed: Mar. 23, 2015

(65) Prior Publication Data
US 2016/0204738 A1 Jul. 14, 2016

Related U.S. Application Data

(60) Provisional application No. 62/101,795, filed on Jan. 9, 2015.

(51) Int. Cl.
*H03B 5/12* (2006.01)

(52) U.S. Cl.
CPC .......... *H03B 5/1262* (2013.01); *H03B 5/1203* (2013.01); *H03B 5/1209* (2013.01); *H03B 5/129* (2013.01); *H03B 5/1228* (2013.01); *H03B 5/1243* (2013.01)

(58) Field of Classification Search
CPC .... H03B 5/12; H03B 5/1206; H03B 5/1209; H03B 5/1212; H03B 5/1228; H03B 5/1231; H03B 5/124; H03B 5/1243; H03B 5/1246; H03B 5/125; H03B 5/1253; H03B 5/1262; H03B 5/1265; H03B 5/129; H03B 2201/038; H03B 2202/06
USPC ............ 331/117 FE, 117 R, 177 V, 185, 186
See application file for complete search history.

(56) References Cited

U.S. PATENT DOCUMENTS

| | | | | |
|---|---|---|---|---|
| 4,924,195 A | * | 5/1990 | Gonda | H03B 5/368 331/107 A |
| 6,747,523 B1 | * | 6/2004 | Ma | H03B 5/1231 331/117 FE |

(Continued)

OTHER PUBLICATIONS

Lee J.Y., et al., "A Low-Phase Noise 5-GHz CCNF Colpitts VCO with Parallel-Branch Inductors," Proceedings of the Bipolar/BiCMOS Circuits and Technology Meeting, 2005, pp. 240-243.
Rogers J.W.M., et al., "The Effect of Varactor Nonlinearity on the Phase Noise of Completely Integrated VCOs," IEEE Journal of Solid-State Circuits, Sep. 2000, pp. 1360-1367, vol. 35 (9).
Partial International Search Report—PCT/US2015/061877—ISA/EPO—Feb. 23, 2016.
Deen M.J., et al., "Low-Power CMOS Integrated Circuits for Radio Frequency Applications—(CODEC 04)", IEE Proceedings—Circuits, Devices and Systems, XP006025223, Oct. 7, 2005, vol. 152, No. 5, pp. 509-522.

(Continued)

*Primary Examiner* — Levi Gannon
(74) *Attorney, Agent, or Firm* — Procopio, Cory, Hargreaves & Savitch, LLP

(57) ABSTRACT

Systems and methods for biasing frequency oscillators to minimize phase noise are disclosed. The system may comprise a tank circuit having an inductor, at least a first coupling capacitor and a second coupling capacitor. The system may further comprise a varactor circuit electrically connected to the first coupling capacitor and the second coupling capacitor. The system may further comprise at least one first metal oxide semiconductor (MOS) device electrically connected in shunt with the tank circuit and a bias voltage. The at least one first MOS device may be electrically connected to a first gate bias voltage configured to bias the at least one first MOS device such that a first gate-to-source voltage of the at least one first MOS device remains below the first threshold voltage.

23 Claims, 7 Drawing Sheets

(56) References Cited

U.S. PATENT DOCUMENTS

| | | | |
|---|---|---|---|
| 6,882,237 B2 | 4/2005 | Singh et al. | |
| 7,053,722 B2* | 5/2006 | Rein | H03B 5/1847 331/117 R |
| 7,057,469 B2* | 6/2006 | Prentice | H03K 3/2821 331/117 FE |
| 7,239,209 B2 | 7/2007 | Adan | |
| 8,035,456 B1* | 10/2011 | Jang | H03B 27/00 331/117 FE |
| 8,143,960 B2 | 3/2012 | Li | |
| 8,193,868 B2* | 6/2012 | Trivedi | H03B 5/1231 331/117 R |
| 2005/0212614 A1 | 9/2005 | Peluso | |
| 2009/0184771 A1 | 7/2009 | Barton et al. | |
| 2010/0194485 A1* | 8/2010 | Chawla | H03B 5/1228 331/117 FE |
| 2011/0156829 A1* | 6/2011 | Wang | H03L 7/0802 331/117 FE |
| 2011/0230155 A1* | 9/2011 | Sapone | H04B 1/26 455/208 |
| 2012/0062287 A1* | 3/2012 | Jang | H03B 5/1228 327/156 |
| 2013/0063219 A1 | 3/2013 | Shanan | |
| 2013/0141175 A1* | 6/2013 | Yin | H03B 5/1847 331/96 |
| 2013/0147566 A1* | 6/2013 | Voinigescu | H03B 5/1231 331/117 FE |
| 2015/0091663 A1* | 4/2015 | Trotta | H03B 1/00 331/117 R |

OTHER PUBLICATIONS

International Search Report and Written Opinion—PCT/US2015/061877—ISA/EPO—Jun. 24, 2016.

Lee H., et al., "A Subthreshold Low Phase Noise CMOS LC VCO for Ultra Low Power Applications", IEEE Microwave and Wireless Components Letters, XP011347281, Nov. 30, 2007, vol. 17, No. 11, pp. 796-798.

* cited by examiner

SYSTEM AND METHOD FOR DYNAMICALLY BIASING OSCILLATORS FOR OPTIMUM PHASE NOISE

CROSS REFERENCE TO RELATED APPLICATIONS

This application claims priority to U.S. Provisional Application No. 62/101,795, filed Jan. 9, 2015, entitled "SYSTEM AND METHOD FOR DYNAMICALLY BIASING OSCILLATORS FOR OPTIMUM PHASE NOISE," which is hereby incorporated by reference in its entirety.

BACKGROUND

1. Technological Field

This disclosure is related to voltage controlled oscillators (VCO) and digitally controlled oscillators (DCO). More particularly, this disclosure presents a system and method for biasing oscillators to minimize phase noise.

2. Background

Digitally controlled or voltage controlled oscillators may have very sensitive nodes where thermal noise may be converted to phase noise around the oscillation frequency. Biasing these nodes may negatively affect the oscillator by lowering the Q-factor of the tank circuit thus increasing its phase noise. Some systems can implement resistive circuitry to minimize varactor noise contribution.

SUMMARY

In general, this disclosure describes techniques related to minimizing phase noise and jitter in frequency oscillators. The systems, methods and devices of this disclosure each have several innovative aspects, no single one of which is solely responsible for the desirable attributes disclosed herein.

One aspect of the disclosure provides a frequency oscillator. The frequency oscillator can have a tank circuit having an inductor. The tank circuit can have a first coupling capacitor, and a second coupling capacitor. The frequency oscillator can also have a varactor circuit electrically coupled to the first coupling capacitor and the second coupling capacitor. The frequency oscillator can also have a first metal oxide semiconductor (MOS) device having a first gate, a first drain, and a first source. The first source can be electrically coupled to the varactor circuit. The frequency oscillator can also have a second MOS device having a second gate, a second drain, and a second source. The second source can be electrically coupled to the varactor circuit opposite the first source. The frequency oscillator can also have a first input electrically coupled to the first drain and the second drain to receive a first bias voltage. The frequency oscillator can also have a second input electrically coupled to the first gate and the second gate to receive a first gate bias voltage.

Another aspect of the disclosure provides a frequency oscillator having a tank circuit. The tank circuit can have at least one inductor and at least one capacitor. The tank circuit can also be electrically coupled in parallel to a variable capacitance circuit. The frequency oscillator can also have a first MOS device having a first gate, a first source, and a first drain. The first source can be electrically coupled to the tank circuit and the variable capacitance circuit. The frequency oscillator can also have a second MOS device having a second gate, a second source, and a second drain. The second source can be electrically coupled to the tank circuit and the variable capacitance circuit. The frequency oscillator can also have a first input electrically coupled to the first drain and the second drain, and configured to receive a first bias voltage. The frequency oscillator can also have a second input electrically coupled to the first gate and the second gate. The second input can be configured to receive a first gate bias voltage. The first gate bias voltage can be selected to bias the first MOS device such that a first gate-to-source voltage of the first MOS device remains below a first threshold voltage, and to bias the second MOS device such that a second gate-to-source voltage of the second MOS device remains below a second threshold voltage, when the frequency oscillator is in operation.

Another aspect of the disclosure provides a method for biasing an oscillator circuit. The method can comprise generating an oscillating output using a tank circuit electrically coupled to a varactor circuit. The method can also comprise biasing the varactor circuit using a first MOS device and a second MOS device. The varactor circuit can be electrically coupled to a first source of the first MOS device and to a second source of the second MOS device. The method can also comprise biasing the first MOS device and the second MOS device with a first gate bias voltage at a first gate of the first MOS device and at a second gate of the second MOS device. The method can also comprise controlling a first transconductance of the first MOS device and a second transconductance of the second MOS device with the first bias voltage and the first gate bias voltage.

Another aspect of the disclosure provides an apparatus for producing an oscillating frequency. The apparatus can have a resonating means for storing energy at a resonant frequency. The resonating means can have and at least one inductor and at least one capacitor. The apparatus can also have a variable capacitance means having a first end and a second end, the first end and the second end being electrically coupled to the resonating means. The apparatus can also have a first transistor means having a first gate, a first drain, and a first source. The first source can be electrically coupled to the first end. The apparatus can also have a second transistor means having a second gate, a second drain, and a second source. The second source can be electrically coupled to the second end. The apparatus can also have a first biasing means electrically coupled to the first drain and the second drain. The apparatus can also have a second biasing means electrically coupled to the first gate and the second gate.

Other features and advantages of the present disclosure should be apparent from the following description which illustrates, by way of example, aspects of the disclosure.

DESCRIPTION OF THE DRAWINGS

The details of embodiments of the present disclosure, both as to their structure and operation, may be gleaned in part by study of the accompanying drawings, in which like reference numerals refer to like parts, and in which.

DETAILED DESCRIPTION

Figure 1:
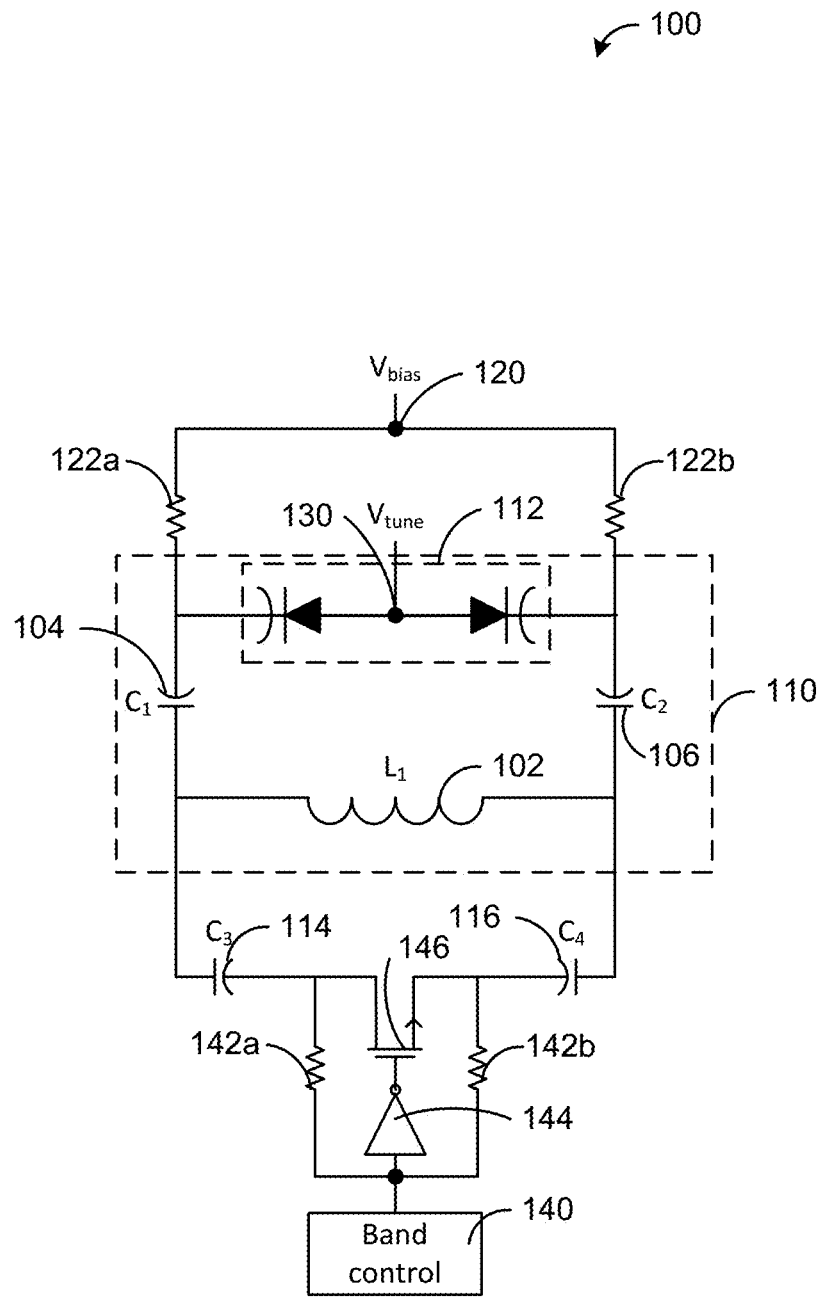
FIG. 1 is a schematic diagram of an oscillator circuit.

The detailed description set forth below, in connection with the accompanying drawings, is intended as a description of various embodiments and is not intended to represent the only embodiments in which the disclosure may be practiced. The detailed description includes specific details for the purpose of providing a thorough understanding of the embodiments. In some instances, well-known structures and components are shown in simplified form for brevity of description. As used herein, like reference numerals refer to like features throughout the written description.

FIG. 1 is a circuit diagram of an oscillator circuit. An oscillator circuit (oscillator) 100 is shown. The oscillator 100 may have an inductor $L_1$ 102 electrically coupled to a pair of coupling capacitors $C_1$ 104 and $C_2$ 106. In some embodiments, the coupling capacitors $C_1$ 104 and $C_2$ 106 electrically "couple" the inductor $L_1$ 102 to a varactor circuit, shown as a pair of varactors 112. The varactors 112 may operate as voltage controlled capacitors. The inductor $L_1$ 102 may further be electrically coupled to a pair of coarse tuning capacitors: a coarse tuning capacitor $C_3$ 114 and a coarse tuning capacitor $C_4$ 116 (referred to hereinafter as "coarse capacitors"). The combination of $L_1$ 102, $C_1$ 104, $C_2$ 106, and the varactors 112 may also be referred to herein as a "tank circuit," "tank" or "LC circuit" 110 (indicated in dashed lines). In some embodiments, the tank 110 can act as an electrical resonator, storing energy oscillating at a characteristic resonant frequency of the circuit.

In some embodiments, the tank 110 may not have all of the components identified in FIG. 1 and described herein, depending on the configuration of the oscillator 100. The tank 110 may have only a single capacitor and a single inductor. In some embodiments the tank 110 can include the $L_1$ 102 in combination with the $C_1$ 104, and the $C_2$ 106, further including the $C_3$ 114 and the $C_4$ 116. In another embodiment, the tank 110 can be considered to include the $L_1$ 102 in combination with the $C_1$ 104, the $C_2$ 106, the $C_3$ 114, and the $C_4$ 116, and the varactors 112. In yet another embodiment, the tank 110 may have additional inductive, capacitive, and resistive circuitry implemented to change or regulate the resonant frequency of the tank 110.

The oscillator 100 can further have an input $V_{bias}$ 120 (hereinafter "$V_{bias}$ 120"). As used herein, an input may generally refer to an electrical coupling that can receive a voltage input, for example. The $V_{bias}$ 120 may be or receive a variable or constant direct current (DC) voltage applied to $C_1$ 104 and $C_2$ 106 of the tank 110. The oscillator 100 may further have an input $V_{tune}$ 130. The $V_{tune}$ 130 may also be or receive a variable or constant DC voltage applied to the varactors 112 to tune or adjust the frequency of the oscillator 100. The capacitance of the varactors 112 can further be a function of the difference between the $V_{bias}$ 120 and the $V_{tune}$ 130. Additionally, as the capacitance of the varactors 112 is changed, the frequency of the oscillator 100 also changes.

In an embodiment, the input $V_{bias}$ 120 and the input $V_{tune}$ 130 in combination with the tank 110 and the varactors 112 can be combined as the oscillator 100 configured as a VCO.

In some embodiments, the oscillator 100 may further comprise a band control input 140 (hereinafter, "band control 140") electrically coupled to the coarse capacitors 114, 116. The coarse capacitors $C_3$ 114 and $C_4$ 116 may form a portion of a switchable capacitor array for use in the oscillator 100 (e.g., a VCO or a DCO). The coarse capacitors $C_3$ 114 and $C_4$ 116, in conjunction with a metal oxide semiconductor (MOS) device 146 (hereinafter referred to as "switch 146") and an inverter 144 can comprise such a switchable array. The switch 146 can be n-type MOS (NMOS) or p-type MOS (PMOS) transistor, having a drain coupled the coarse capacitor $C_3$ 114, a source coupled to the other coarse capacitors $C_4$ 116, and a gate coupled to a control signal, shown as the band control 140. The band control 140 can be coupled to the switch 146 via an inverter 144. In some embodiments, the inverter 144 may not be present.

The band control 140 can provide a digital control signal for a DCO to generate a clock signal, for example. Thus the bottom portion of the oscillator 100 of FIG. 1, taken by itself, may comprise a DCO. The band control 140 may supply the digital signal to the inverter 144 and the switch 146 to induce a voltage to the tank 110. The inverter 144 and the switch 146 may not be required for certain VCO implementations.

In some embodiments, a number of resistors may be included in the oscillator 100 to minimize the phase noise contributed by the varactors 112. For example, resistors 122a, 122b (collectively resistors 122) may be incorporated in the oscillator 100 in shunt between the $V_{bias}$ 120 and the tank 110. The value of the resistors 122 can be selected to be high enough to minimize the noise contribution of the varactors 112 but low enough so as to not increase the thermal noise of contribution of the tank circuit (that would negatively affect the Q-factor of the tank 110). Accordingly, the resistor value may be in the kilo ohm (kΩ) range (e.g., 1 kΩ-1000 kΩ). However, in such an embodiment, the resistors 122 themselves can contribute varying levels of thermal noise, resulting in phase noise and jitter induced in the output of the oscillator 100.

In a similar fashion, resistors 142a, 142b (collectively resistors 142) may also be incorporated in the oscillator 100 to bias the switch 146. Using the threshold voltage ($V_{th}$) of the switch 146, the value of the resistors 142 can be selected to turn the switch 146 on and off based on the signal supplied by the band control 140. The switch 146 can thus be used to reliably switch the coarse capacitors $C_3$ 114 and $C_4$ 116 on or off from (or in and out of) the LC tank 110 so that the oscillator 100 can precisely generate a specified high frequency signal according to the band control 140 signal. In some embodiments, the band control 140 is a digital signal that will alternatively switch the coarse capacitors $C_3$ 114 and $C_4$ 116 in and out of the oscillator 100 circuit to create the output signal (e.g., a clock signal).

In some embodiments, the thermal noise added by the resistors 122, 142 may be a result of thermal flux inside the individual resistors 122, 142. The thermal flux may add a noise component to the VCO frequency and ultimately manifest as phase noise (in a VCO, for example) or jitter (in a DCO, for example). The phase noise/jitter degrades the spectral purity of the oscillator 100 and may negatively affect the Q-factor.

Figure 2:
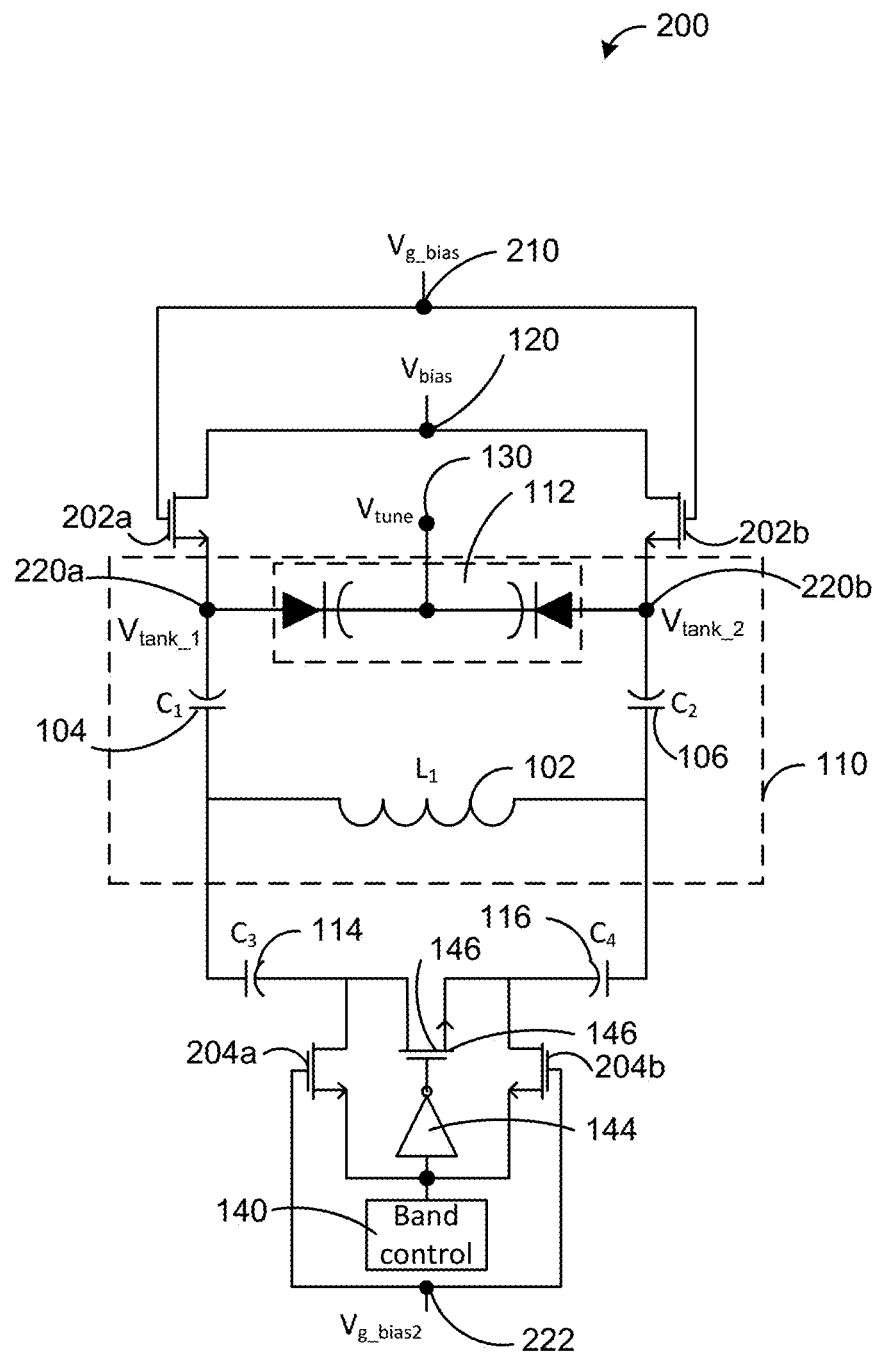
FIG. 2 is a schematic diagram of an oscillator circuit incorporating transistors to reduce phase noise.

FIG. 2 is a circuit diagram of an oscillator circuit incorporating transistors to reduce phase noise. As shown, an oscillator 200 may resemble the oscillator 100 and comprise several similar components. Accordingly, like numbers indicate like components.

The oscillator 200 may have the tank 110 as described above with the associated varactors 112. The oscillator 200 may be configured to produce an output voltage $V_{tank}$ 220 at a specific or variable resonant frequency, similar to the oscillator 100. The $V_{tank}$ is shown as $V_{tank\_1}$ 220a and $V_{tank\_2}$ 220b representing outputs of the oscillator 200. The outputs at $V_{tank\_1}$ 220a and $V_{tank\_2}$ 220b can be located at opposite ends (e.g., a first end and a second end) of the varactors 112 or other variable capacitance circuit.

The oscillator 200 may further comprise transistors in place of the resistors 122, 142 of FIG. 1. As noted above, high value or high resistance/impedance resistors (e.g., the resistors 122, 142 of the oscillator 100), add phase noise or jitter to the output of the oscillator 100. This can manifest as a reduction in the Q-factor of the oscillator 100 or a disruption of its spectral purity. The replacement of such high value resistors with for example, transistors, can present high impedance without contributing to the phase noise or jitter associated with the resistors 122.

In some embodiments, the oscillator 200 includes MOS devices 202a, 202b (collectively MOS devices 202) in place of the resistors 122 of FIG. 1. The MOS devices 202 can be implemented as NMOS or PMOS devices, depending on requirements and polarity within the desired oscillator circuit. For example, the MOS devices can be MOSFETs (MOS Field Effect Transistors) or other transistors having similar characteristics. The gates of the MOS devices 202 can be electrically coupled to an input to receive a gate bias voltage $V_{g\_bias}$ 210. The $V_{g\_bias}$ 210 may be controlled to bias the operation of the MOS devices 202 in order to control the impedance and transconductance of the MOS devices 202. Such biasing can prevent the gate-to-source voltage ($V_{gs}$) of the MOS devices 202 from exceeding their respective threshold voltages. The characteristic threshold voltages of the respective MOS device 202, 204, may be referred to herein as "$V_{th}$." This is discussed in more detail below.

In some embodiments, the oscillator 200 may further have MOS devices 204a, 204b (collectively, MOS devices 204). The MOS devices 204 may be electrically coupled to the oscillator 200 in place of the resistors 142 (FIG. 1). The gates of each of the MOS devices 204 may further be electrically coupled to an input to receive a second gate bias voltage, $V_{g\_bias2}$ 222. The $V_{g\_bias2}$ 222 can be set to bias the operation of the MOS devices 204. Accordingly, MOS devices 204 can provide high impedance (from gate to source) and low noise by preventing the $V_{gs}$ of the MOS devices 204 from exceeding $V_{th}$, similar to above.

In some embodiments, the input for $V_{g\_bias}$ 210 may be electrically connected to the gates of each of the MOS devices 202 to bias the transconductance of the MOS devices 202. As used herein, "transconductance" may generally refer to the current induced within the MOS devices 202 from their respective sink to drain. Such MOS devices 202 may be implemented to bias the high swing nodes of the oscillator 200.

The $V_{g\_bias}$ 210 may be set such that $V_{g\_bias}$ 210 is less than or equal to the sum of the $V_{bias}$ and the $V_{th}$ of the MOS device 202. In other words:

$$V_{g\_bias} \leq V_{bias} + V_{th} \quad (1)$$

As used herein, the $V_{th}$ can generally describe the minimum gate-to-source voltage ($V_{gs}$) differential required to induce a conductive path (transconductance) between the source and drain of the particular MOS device 202. Thus, where $V_{gs}$ exceeds $V_{th}$, a conductive channel is gradually opened between the respective source and drain, increasing transconductance of the given MOS device (e.g., the MOS devices 202, 204). In some embodiments, biasing the MOS devices 202, 204 in such a manner may result in noise near oscillation peaks, due to the increased transconductance and the peak $V_{gs}$. However, the oscillator 200 is less sensitive to noise (e.g., phase noise, or jitter) at the oscillation peaks and any noise induced at the peaks of the oscillation may be negligible.

As the gate-to-source voltage ($V_{gs}$) of the MOS devices 202 (or the MOS devices 204) approaches or exceeds $V_{th}$, the respective transconductance increases. Additionally, as the source-to-drain conductive channel is opened in the MOS devices 202, thermal noise may also increase. Increased $V_{gs}$ may result in increased noise. This produces a similar effect as the resistors 122. Increased transconductance can also decrease the impedance of the MOS device 202 from source to drain, further increasing noise. Conversely, when transconductance is very low, the impedance of the MOS device 202 is very high and the conductive channel from source to drain is closed. In some embodiments, the impedance may increase into the range of mega ohms (MΩ) under such circumstances. Furthermore, when the transconductance is very low, the thermal noise added by the MOS devices 202 is also very low.

Accordingly, when the MOS devices 202 are biased according to equation 1 above, $V_{gs}$ does not exceed the $V_{th}$ of the MOS devices 202. Biasing the varactors 112 in such a manner presents the high impedance that can prevent reduction of the Q factor, while minimizing the thermal noise that would otherwise be present with use of the resistors 122 (FIG. 1). Therefore, use of the MOS devices 202 results in low noise yet high impedance of the MOS devices 202 at the oscillation nodes.

In other embodiments, the $V_{g\_bias2}$ 222 may be adjusted in a similar fashion. In use with a DCO, the resistors 142 (FIG. 1) may be replaced with the MOS devices 204. When the gates of the MOS devices 204 are appropriately biased to maintain a $V_{gs}$ less than $V_{th}$, in accordance with equation 1 above, the impedance of the MOS devices 204 remains high, reducing the amount of noise induced in the system in the same manner as the MOS devices 202.

As noted above, tunable LC-based DCOs and many VCOs can have a switchable capacitor array (e.g., the coarse capacitors $C_3$ 114 and $C_4$ 116) used for tuning the frequency produced by the oscillator 100, 200. When the coarse capacitors $C_3$ 114 and $C_4$ 116 are switched into the circuit, their Q is limited by the resistance of the switch 146, which if too low, can reduce the Q of the tank leading to higher induced thermal noise. When the capacitors $C_3$ 114 and $C_4$ 116 are switched off, or out of the circuit, the MOS devices 204 can be used to bias the source and drain of the switch 146 to ensure the switch 146 turns off with a reasonable settling time. In use with the oscillator 100, the resistors 142 need to be large so as to not degrade the Q of the tank 110, so they can take up a relatively large physical area. Conversely, the use of the MOS devices 204 presents high impedance without the associated noise of the resistors 142. In some embodiments, the MOS devices 204 also occupy less space than a resistor 142 with comparable impedance.

Figure 3:
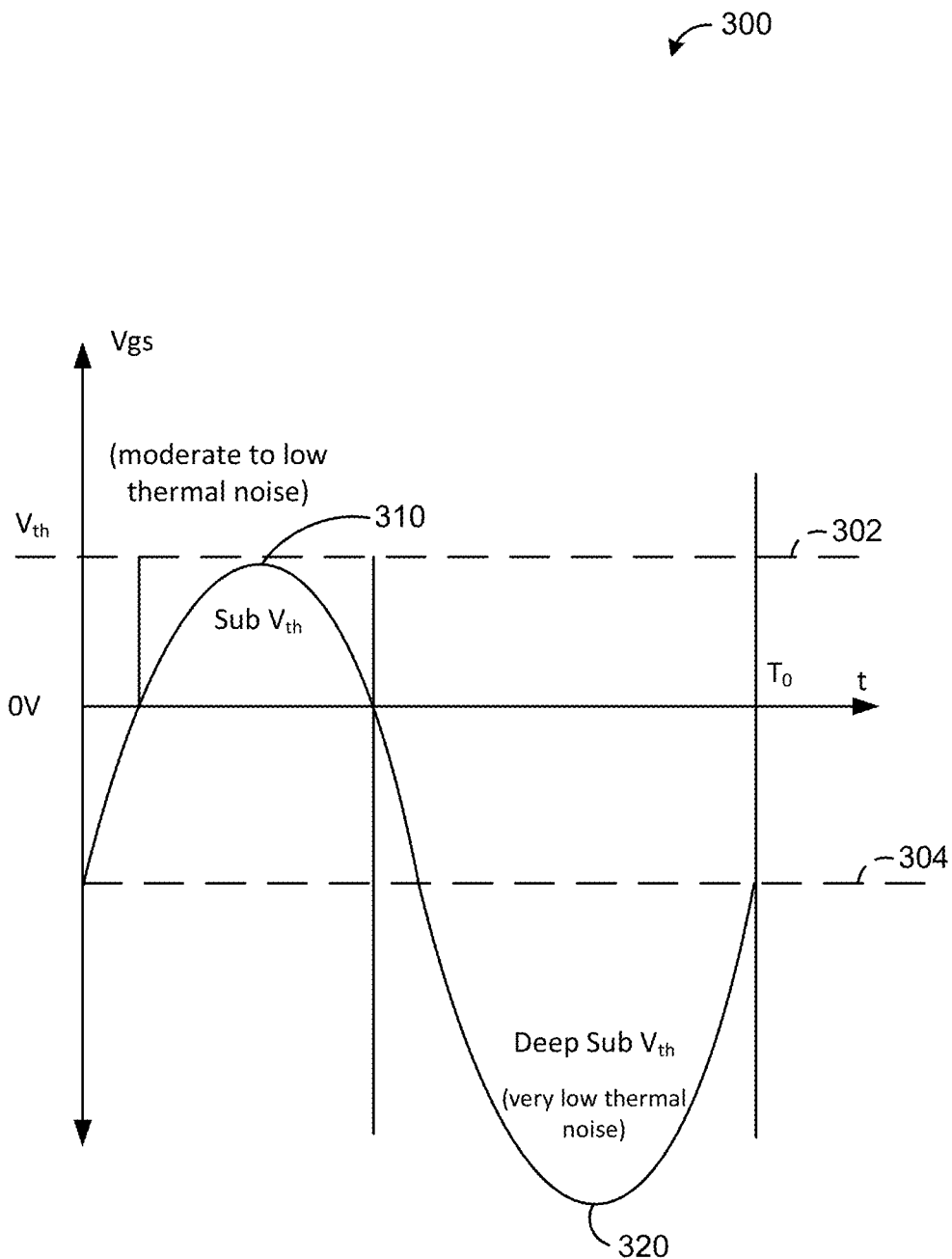
FIG. 3 is a plot of gate-to-source voltage over time of the MOS devices of FIG. 2.

FIG. 3 is a plot of gate-to-source voltage over time of the MOS devices of FIG. 2. A plot 300 depicts $V_{gs}$ on the vertical (y) axis versus time (t) on the horizontal (x) axis. The $V_{gs}$ on the y axis is representative of the $V_{gs}$ of an exemplary MOS device implemented as the MOS devices 202. The $V_{gs}$ of the plot 300 is also representative of the MOS devices 204 when the coarse capacitors C3 114, C4 116 are switched on and off. In operation, one of the coarse capacitors C3 114, C4 116 will be switched off when the other is switched on, resulting in a voltage response similar to the plot 300. In such an embodiment, the output may be a square wave or other variety of clock signal. The plot 300 further depicts the $V_{th}$ of the MOS devices 202, 204 as a dashed line 302.

In some embodiments, the plot 300 is a graphical representation of the oscillation frequency (e.g., a sine wave) of an associated VCO (e.g., the oscillator 200) as biased by the gate voltage $V_{g\_bias}$ 210 of FIG. 2. The plot 300 may also be representative of the DCO (e.g., the oscillator 200) biased by the gate voltage $V_{g\_bias2}$ 222. In an embodiment, the amplitude (in volts) of the oscillations is maintained below the $V_{th}$ of the MOS devices 202, 204 in order to prevent significant transconductance of the MOS device 202, 204 and the resulting noise. Accordingly, the MOS devices 202, 204 remain in a moderate or weak inversion state when the $V_{gs}$ remains sub-threshold ($V_{th}$).

As shown, the oscillation frequency may rise as high as a point 310, representing a peak $V_{gs}$ value slightly below $V_{th}$, in a region labeled "sub $V_{th}$." At the point 310, the MOS device 202, 204 may product a small amount of transconductance, and thus a low to moderate amount of thermal noise. However any amount of noise generated may still be minimal and centered at the oscillation peaks.

In some embodiments the oscillator 200 is highly sensitive to noise (e.g., phase noise, jitter) as the output voltage (e.g., $V_{tank}$) crosses a value of zero at a node. A line 304 (dashed line) approximates the $V_{gs}$ at the nodes, or zero crossing of the oscillator 200 output. The voltage $V_{gs}$ at the line 304 is a negative value, resulting in high impedance at the source and drain of the MOS device 202, 204 and correspondingly low noise contribution. However, since the thermal noise at the point 310 occurs at the peak voltage, the phase noise contribution to the oscillator output is negligible.

The NMOS or PMOS components implemented as the MOS device 202 contribute very little to noise as they spend approximately one quarter of the oscillation cycle in the sub-threshold region (e.g., moderate inversion) and approximately three quarters of the oscillation cycle in the deep-sub-threshold region (e.g., weak-inversion) where the noise output of the MOS devices 202 is much lower.

Over time, as the $V_{gs}$ level decreases from the point 310 to a point 320, the $V_{gs}$ decreases into a negatively biased region below zero (e.g., a negative $V_{gs}$ voltage), referred to as the "deep sub $V_{th}$," as noted. In the negatively biased region, the transconductance is zero or negative, producing a very high impedance and very low thermal noise.

Figure 4A:
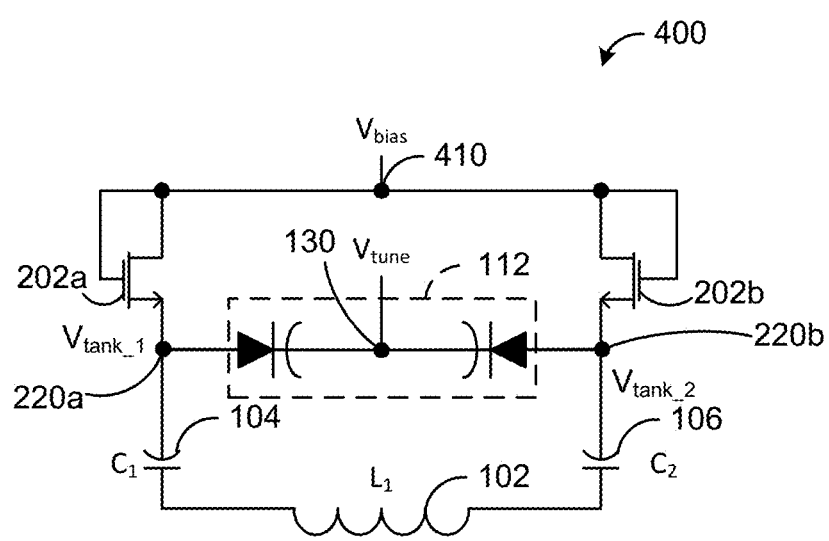
FIG. 4A is a circuit diagram of another embodiment of an oscillator circuit.

FIG. 4A is a circuit diagram of another embodiment of the oscillator for FIG. 2. As shown, a VCO 400 may be similar to a portion of the oscillator 200 (FIG. 2). The VCO 400 may have the MOS devices 202 as in FIG. 2, however the $V_{g\_bias}$ 210 and $V_{bias}$ 120 (FIG. 1) may be equal ($V_{bias}=V_{g\_bias}$ bias) and thus are combined into a single voltage source $V_{bias}$ at an input $V_{bias}$ 410. In certain embodiments, it is possible to couple the gate and drain of each of the MOS devices 202 to the same voltage source $V_{bias}$ 410. This may provide additional options and provide greater simplicity in physical oscillator circuit design. In some embodiments, the VCO 400 can provide similar output as the oscillator 200.

In some embodiments of the VCO 400, the bias node of the varactors 112 has almost as much voltage swing as the LC tank circuit 110. This voltage swing allows for an active device (e.g., the MOS devices 202) to traverse between moderate-inversion (sub-threshold) to weak inversion (deep sub-threshold) or even to an off state, increasing impedance.

Figure 4B:
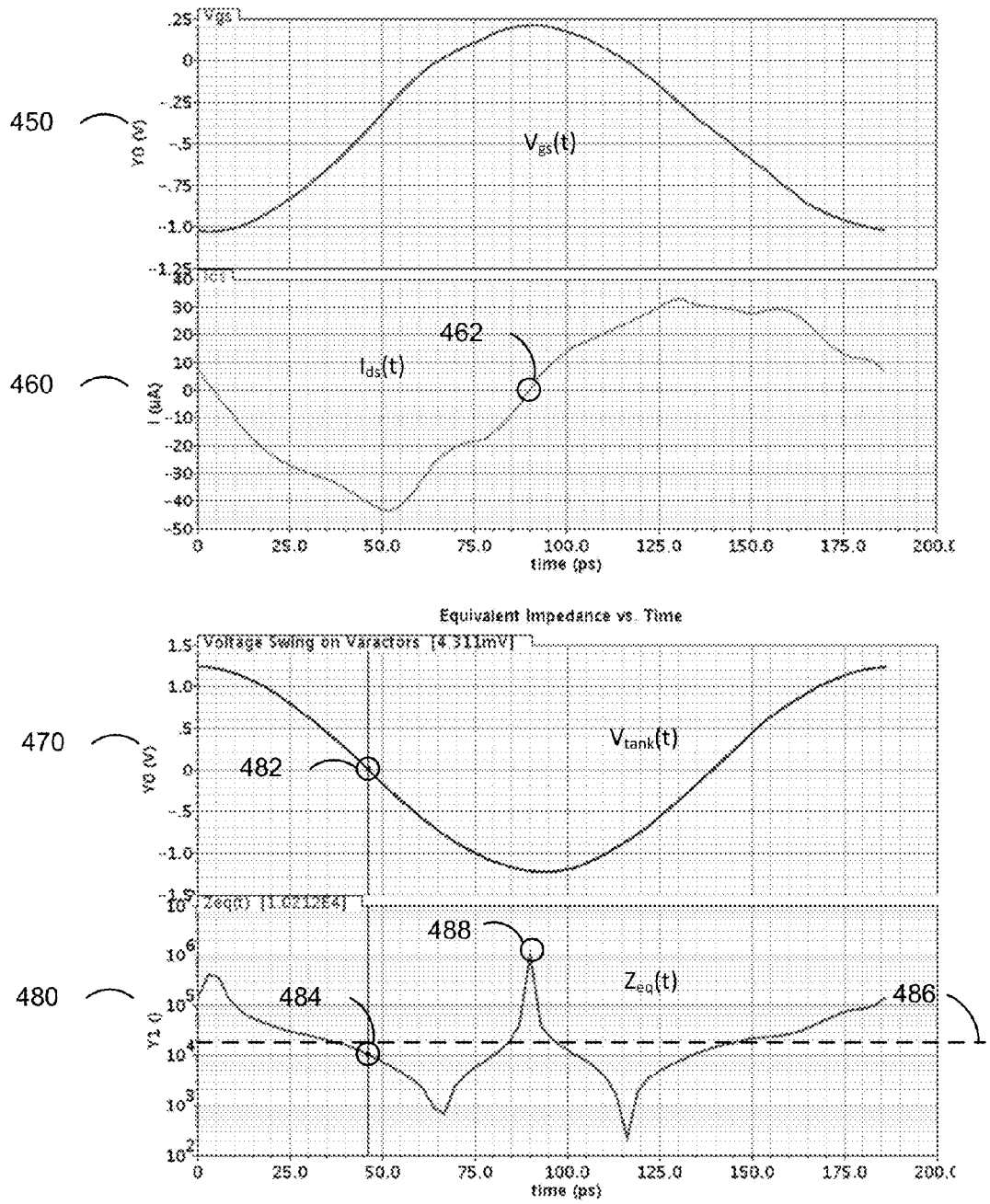
FIG. 4B is comparison of four plot diagrams of voltage, current, and impedance values of the oscillator circuit of FIG. 4A over time.

FIG. 4B is comparison of four plot diagrams of voltage, current, and impedance values of the oscillator of FIG. 4A over time. A plot 450 depicts $V_{gs}$ in volts (V) of a MOS device implemented in the VCO 400, (e.g., the MOS devices 202) as a function of time (t) in picoseconds (ps). The plot 450 depicts voltage on the vertical (y) axis versus time (t) on the horizontal (x) axis.

A plot 460 depicts current from drain to source ($I_{ds}$) in microamps (μA), as a function of time. The plot 460 depicts current on the y-axis versus time (t) on the x-axis.

A plot 470 depicts a variation of voltage across the varactors 112, referred to herein as "$V_{tank}$," as a function of time (t). The $V_{tank}$ may be similar to the V 220 tank (FIG. 2). The plot 470 depicts $V_{tank}$ on the y-axis versus time (t) on the x-axis.

A plot 480 depicts the equivalent impedance ($Z_{eq}$) of one of the MOS devices used to bias the varactors (e.g., the MOS devices 202, 204) as a function of time (t). The plot 480 shows the impedance ($Z_{eq}$) of the MOS devices 202, 204 in ohms (Ω) on the y-axis versus time on the x-axis.

FIG. 4B shows each of the four plot diagrams 450, 460, 470, 480 with the same time scale where $V_{g\_bias}$ is equal to $V_{bias}$. In general, FIG. 4B depicts measurements taken from the VCO 400 (FIG. 4A) as a function of time.

In an embodiment, the $V_{bias}$ 410 may be set such that the $V_{gs}$ of the MOS devices 202 is maintained below the $V_{th}$. In the embodiment described by the plot 450, the maximum $V_{gs}$ attained is approximately 0.24V. For example, the $V_{th}$ of the MOS device 202 shown may be 0.25V; therefore the associated source-drain current path is never fully open. This is depicted by the parallel plot 460 of $I_{ds}$ as a function of time. The current ($I_{ds}$) is the current flowing from the drain to source (e.g., trans conductance) of the MOS devices 202 over time, according to the $V_{gs}$ of the MOS device 202 being measured. The $I_{ds}$ varies from a negative value (e.g., drain to source) of approximately −44 μA when the $V_{gs}$ is approximately −0.3V, to a high value of approximately +34 μA when the $V_{gs}$ is −0.25V. The $I_{ds}$ current remains very small, in terms of μA because the $V_{gs}$ remains below $V_{th}$, minimizing transconductance. In general, the $I_{ds}$ has a delay or lags behind the $V_{gs}$ in time. The lag may vary with output frequency and MOS device 202, 204 composition; however, the time lag of the current $I_{ds}$ may also produce various spikes in equivalent impedance ($Z_{eq}$). One such spike is shown at a point 488 of the plot 480, corresponding to the $I_{ds}$ of the MOS device 202 as it inverts (e.g., negative current to positive current) at a point 462 of the plot 460.

The plot 470 is shown indicating the zero crossing of $V_{tank}$ 220 at a point 482. The point 482 coincides with a high $Z_{eq}$ value of approximately $10^4$ ohms, or 10 kΩ at a point 484. This prevents transconductance of the MOS device 202 while minimizing phase noise. As noted previously, the zero crossing is the point at which an oscillator (e.g., the VCO 400) is most sensitive to phase noise. An increase in phase noise near the zero crossing of the $V_{tank}$ may adversely affect the oscillator frequency, and therefore the Q factor and spectral purity. Accordingly, phase noise should be kept to a minimum near the zero crossing. This may be accomplished by maintaining a high $Z_{eq}$ at the zero crossing as shown. Additionally, maintaining a $V_{gs}$ in a subthreshold region also results in a relatively high average equivalent impedance ($Z_{eq}$) as approximated by a dashed line 486.

Figure 5A:
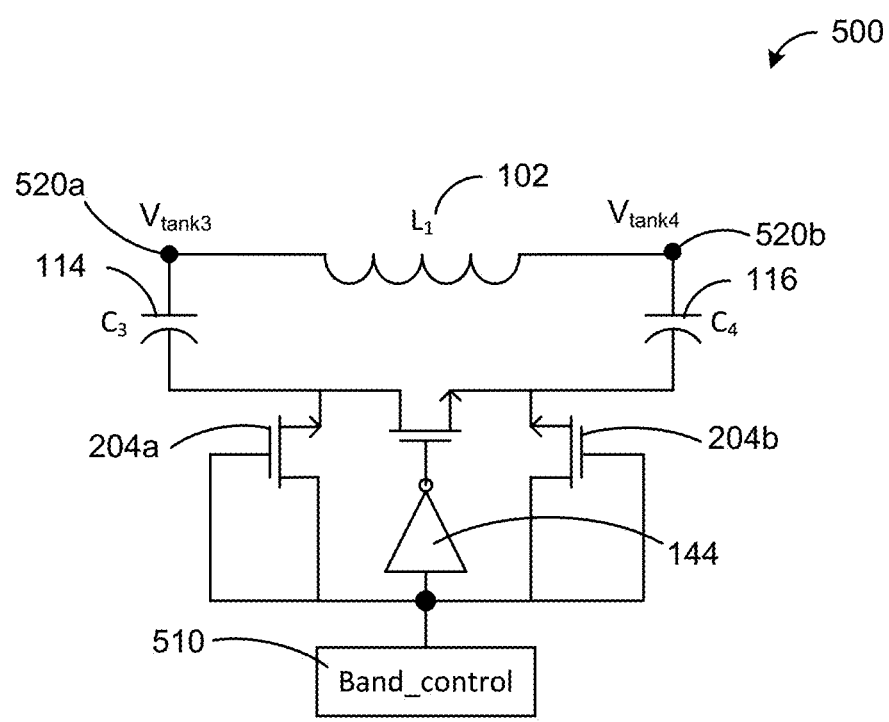
FIG. 5A is a circuit diagram of another embodiment of an oscillator circuit for FIG. 2.

FIG. 5A is a circuit diagram of another embodiment of the oscillator for FIG. 2. As shown, a DCO 500 may resemble a portion of the oscillator 200 (FIG. 2). The DCO 500 may have the MOS devices 204 as in FIG. 2, however the $V_{g\_bias2}$ 222 and the band control 140 (FIG. 1) may be equal ($V_{g\_bias2}$ band_control) and thus are combined into a single voltage source labeled band control 510. In certain embodiments, the gate and drain of each of the MOS devices 204 may be coupled to the same input to receive an equivalent voltage source from a band control 510. This may provide additional options and provide greater simplicity in physical oscillator circuit design. In some embodiments, the DCO 500 is similar to the oscillator 200.

In an embodiment, the DCO 500 may be configured to provide an output $V_{tank3}$ 520a and $V_{tank}$ 520b, collectively referred to as "$V_{tank}$ 520." The $V_{tank}$ 520 may be a digital clock signal or similar DCO 500 output.

Figure 5B:
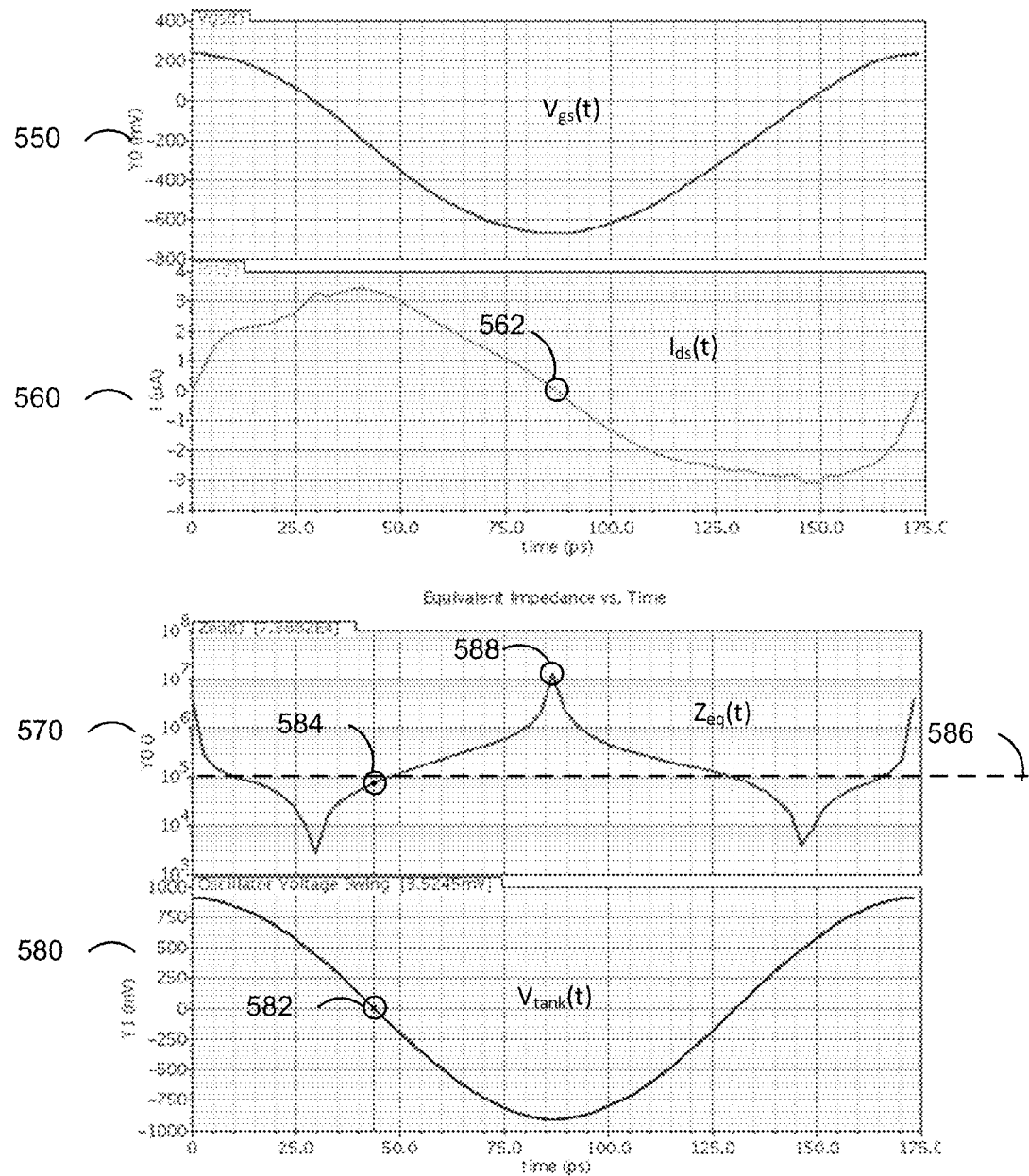
FIG. 5B is a comparison of four plot diagrams of voltage, current, and impedance values of the oscillator circuit of FIG. 5A over time.

FIG. 5B is a comparison of four plot diagrams of voltage, current, and impedance values of the oscillator circuit of FIG. 5A over time. A plot 550 depicts $V_{gs}$ in volts (V) of a MOS device implemented in the DCO 500, (e.g., the MOS devices 204) as a function of time (t) in picoseconds (ps). The plot 550 depicts voltage on the vertical (y) axis versus time (t) on the horizontal (x) axis.

A plot 550 depicts $V_{gs}$ in volts (V) of a MOS device implemented in the DCO 500, (e.g., the MOS devices 204) as a function of time (t) in picoseconds (ps). The plot 550 depicts voltage on the vertical (y) axis versus time (t) on the horizontal (x) axis.

A plot 560 depicts current from drain to source ($I_{ds}$) in microamps (μA), as a function of time. The plot 460 depicts current on the y-axis versus time (t) on the x-axis.

A plot 570 depicts the equivalent impedance ($Z_{eq}$) of one of the MOS devices used to bias the DCO 500 (e.g., the MOS devices 204) as a function of time (t). The plot 570 shows the impedance ($Z_{eq}$) of the MOS devices 204 in ohms (Ω) on the y-axis versus time on the x-axis.

A plot 580 depicts a variation of voltage output pf the DCO 500, referred to herein as "$V_{tank}$," as a function of time (t). The $V_{tank}$ may be similar to the V 220 tank (FIG. 2) but a DCO output as opposed to a VCO output. The plot 580 depicts $V_{tank}$ on the y-axis versus time (t) on the x-axis.

FIG. 5B shows each of the four plot diagrams 550, 560, 570, 580 with the same time scale where $V_{g\_bias2}$ 222 (FIG. 2) is equal to band control 140 (FIG. 2). In general, FIG. 5B depicts oscillator voltage taken from the DCO 500 (FIG. 5A) output as a function of time.

In an embodiment, the band control 510 may be set such that the $V_{gs}$ of the MOS devices 204 is maintained below the $V_{th}$. In the embodiment described by the plot 550, the maximum $V_{gs}$ attained is approximately 0.24V, 0r 240 millivolts (mV), as shown. For example, the $V_{th}$ of the MOS device 202 may be 250 mV, therefore the source-drain ($I_{ds}$) current path is never fully open allowing only a minimum current. This is depicted by the parallel plot 460 of $I_{ds}$ as a function of time. The current ($I_{ds}$) is the current flowing from the drain to source (e.g., transconductance) of the MOS device 204 over time, according to the $V_{gs}$ of the same MOS device 204. The $I_{ds}$ varies from a positive value (e.g., drain to source) of approximately +3.5 μA, to a value of approximately −3 μA. Similar to FIG. 4B, the $I_{ds}$ current remains very small, in terms of μA because the $V_{gs}$ remains below $V_{th}$, minimizing transconductance and maintaining high impedance. In general, the $I_{ds}$ is delayed behind the $V_{gs}$ in time. The lag may vary with DCO 500 output frequency, however, the time lag of the current $I_{ds}$ may also produce various spikes in equivalent impedance $Z_{eq}$, (shown in the plot 570) as the $I_{ds}$ of the MOS device 204 inverts at a point 562. The point 562 thus corresponds with an spike in $Z_{eq}$, at a point 588 as the $I_{ds}$ inverts at the point 562. This may be a similar phenomenon to that shown in FIG. 4B and the plot 480.

The plot 580 is shown indicating the zero crossing of $V_{tank}$ 520 at a point 582. The point 582 coincides with a $Z_{eq}$ value of approximately $10^5$ ohms, or 100 kΩ at a point 584 on the plot 570. This high impedance prevents transconductance of the MOS device 204 while minimizing phase noise or jitter. As noted previously, the zero crossing is the point at which a digitally controlled oscillator (e.g., the 500) is most sensitive to jitter. An increase in jitter near the zero crossing of the $V_{tank}$ 520 may adversely affect the frequency, accuracy, and precision of the DCO 500. Accordingly, jitter should be kept to a minimum near the zero crossing. This may be accomplished by maintaining a high $Z_{eq}$ at the zero crossing as shown. Additionally, maintaining a $V_{gs}$ in a subthreshold region also results in relatively high average equivalent impedance ($Z_{eq}$) as approximated by a dashed line 586.

When one of the coarse capacitors $C_3$ 114, $C_4$ 116, is switched into the DCO 500, the voltage swing at the MOS devices 204 is very low on this node. The long/narrow biasing NMOS provides a high impedance, indicated by the plot 570. When the other coarse capacitor ($C_3$ 114, $C_4$ 116) is switched out of the DCO 500, the voltage swing drives high, allowing for the MOS devices 204 to traverse between moderate-inversion (sub-threshold) to weak inversion (deep sub-threshold) as shown in the plot 300 (FIG. 3). The deep subthreshold region may also produce an "off" state, eliminating current flow ($I_{ds}$) and again providing the desired high impedance ($Z_{eq}$).

The above description of the disclosed embodiment is provided to enable any person skilled in the art to make or use the disclosure. Various modifications to these embodiments will be readily apparent to those skilled in the art, and the generic principles described herein can be applied to other embodiment without departing from the spirit or scope of the disclosure. Thus, it is to be understood that the description and drawings presented herein represent a presently preferred implementation of the disclosure and are therefore representative of the subject matter which is broadly contemplated by the present disclosure. It is further understood that the scope of the present disclosure fully encompasses other embodiment that may become obvious to those skilled in the art and that the scope of the present disclosure is accordingly limited by nothing other than the appended claims.

What is claimed is:

1. A frequency oscillator comprising:
   a tank circuit having an inductor, a first coupling capacitor, and a second coupling capacitor;
   a varactor circuit electrically coupled to the first coupling capacitor and the second coupling capacitor;
   a first MOS device having a first gate, a first drain, and a first source, the first source being electrically coupled to the varactor circuit, and the first gate being electrically coupled to the first drain;
   a second MOS device having a second gate, a second drain, and a second source, the second source being electrically coupled to the varactor circuit opposite the first source and the second gate being electrically coupled to the second drain;
   a first input electrically coupled to the first drain and the second drain operable to receive a first bias voltage; and
   a second input electrically coupled to the first gate and the second gate to receive a first gate bias voltage.

2. The frequency oscillator of claim 1 further comprising:
   a first coarse tuning capacitor electrically coupled to the first coupling capacitor and the inductor;
   a second coarse tuning capacitor electrically coupled to the second coupling capacitor and the inductor;

a third MOS device having a third gate, a third drain, and a third source, the third drain being electrically coupled to the first coarse tuning capacitor;

a fourth MOS device having fourth gate, a fourth drain, and a fourth source, the fourth drain being electrically coupled to the second coarse tuning capacitor;

a band control input electrically coupled to the third source and the fourth source;

a third input electrically coupled to the third gate and the fourth gate to receive a second gate bias voltage.

3. The frequency oscillator of claim 2, wherein the band control input is electrically coupled to the third input.

4. The frequency oscillator of claim 2, wherein the band control input and the third input are configured to receive at least one bias voltage, the at least one bias voltage selected to negatively bias the third MOS device and the fourth MOS device.

5. The frequency oscillator of claim 2 further comprising a switch having a switch gate, a switch drain, and a switch source, the switch gate being electrically coupled to the band control input, the switch drain being electrically coupled to the first coarse tuning capacitor and the third MOS device, and the switch source being electrically coupled to the second coarse tuning capacitor and the fourth MOS device.

6. The frequency oscillator of claim 1, wherein the first input is electrically coupled to the second input, and wherein the first gate bias voltage is equal to the first bias voltage.

7. The frequency oscillator of claim 1, wherein the first input and the second input are configured to receive at least one bias voltage, the at least one bias voltage selected to negatively bias the first MOS device and the second MOS device.

8. The frequency oscillator of claim 1, wherein the first MOS device and the second MOS device are configured to bias the varactor circuit and isolate a phase noise contribution of the first MOS device and the second MOS device to an oscillation peak of an output of the frequency oscillator.

9. A frequency oscillator comprising:
a variable capacitance circuit;
a tank circuit having at least one inductor and at least one capacitor, the tank circuit being electrically coupled in parallel to the variable capacitance circuit;
a first MOS device having a first gate, a first source, and a first drain, the first source electrically coupled to the tank circuit and the variable capacitance circuit, and the first gate being electrically coupled to the first drain;
a second MOS device having a second gate, a second source, and a second drain, the second source electrically coupled to the tank circuit and the variable capacitance circuit, and the second gate being electrically coupled to the second drain;
a first input electrically coupled to the first drain and the second drain, and configured to receive a first bias voltage; and
a second input electrically coupled to the first gate and the second gate, the second input configured to receive a first gate bias voltage, the first gate bias voltage operable to bias the first MOS device such that a first gate-to-source voltage of the first MOS device remains below a first threshold voltage, and to bias the second MOS device such that a second gate-to-source voltage of the second MOS device remains below a second threshold voltage, when the frequency oscillator is in operation.

10. The frequency oscillator of claim 9, further comprising:
a first coarse tuning capacitor and a second coarse tuning capacitor electrically coupled to the tank circuit;
a third MOS device having a third gate, a third source, and a third drain, the third source electrically coupled to the first coarse tuning capacitor;
a fourth MOS device having a fourth gate, a fourth source, and a fourth drain, the fourth source electrically coupled to the second coarse tuning capacitor;
a band control input electrically coupled to the third drain and the fourth drain; and
a third input electrically coupled to the third gate and the fourth gate to receive a second gate bias voltage, the second gate bias voltage being configured to bias the third MOS device such that a third gate-to-source voltage remains below a third threshold voltage and to bias the fourth MOS device such that a fourth gate-to-source voltage remains below a fourth threshold voltage.

11. The frequency oscillator of claim 10, wherein the band control input is electrically coupled to the third input.

12. The frequency oscillator of claim 9, wherein the first input is electrically coupled to the second input, and wherein the first gate bias voltage is equal to the first bias voltage.

13. The frequency oscillator of claim 9, wherein the first input and the second input are configured to receive at least one bias voltage, the at least one bias voltage selected to negatively bias the first MOS device and the second MOS device.

14. A method for biasing an oscillator circuit, comprising:
generating an oscillating output using a tank circuit electrically coupled to a varactor circuit;
biasing the varactor circuit using a first MOS device having a first threshold voltage and a second MOS device having a second threshold voltage, the varactor circuit being electrically coupled to a first source of the first MOS device and to a second source of the second MOS device;
biasing the first MOS device and the second MOS device with a first gate bias voltage at a first gate of the first MOS device and at a second gate of the second MOS device;
electrically coupling the first gate of the first MOS device to a first drain of the first MOS device;
electrically coupling the second gate of the second MOS device to a second drain of the second MOS device; and
controlling a first transconductance of the first MOS device and a second transconductance of the second MOS device with a first bias voltage and the first gate bias voltage.

15. The method of claim 14, further comprising:
generating a digital clock signal using the tank circuit and a band control input, the tank circuit being electrically coupled to a first coarse tuning capacitor and a second coarse tuning capacitor;
biasing a third MOS device and a fourth MOS device with a second gate bias voltage at a third gate of the third MOS device and at a fourth gate of the fourth MOS device, the band control input being electrically coupled to a third source of the third MOS device and a fourth source of the fourth MOS device; and
controlling a third transconductance of the third MOS device and a fourth transconductance of the fourth MOS device using the band control input and the second gate bias voltage.

16. The method of claim 15 further comprising electrically coupling the band control input to the second gate bias voltage.

17. The method of claim 14, further comprising electrically coupling the first gate bias voltage to the first bias voltage.

18. The method of claim 14, wherein a difference between the first bias voltage and the first gate bias voltage is not greater than the first and second threshold voltages.

19. An apparatus for producing an oscillating frequency comprising:
 a resonating means for storing energy at a resonant frequency, the resonating means having and at least one inductor and at least one capacitor;
 a variable capacitance means having a first end and a second end, the first end and the second end being electrically coupled to the resonating means;
 a first transistor means having a first gate, a first drain, and a first source, the first source being electrically coupled to the first end, and the first gate being electrically coupled to the first drain;
 a second transistor means having a second gate, a second drain, and a second source, the second source being electrically coupled to the second end, and the second gate being electrically coupled to the second drain;
 a first biasing means electrically coupled to the first drain and the second drain; and
 a second biasing means electrically coupled to the first gate and the second gate.

20. The apparatus of claim 19, wherein the variable capacitance means comprises a varactor circuit having the first end and the second end, the first end being electrically coupled to a first coupling capacitor and the second end being electrically coupled to a second coupling capacitor.

21. The apparatus of claim 19, further comprising:
 a third transistor means having a third gate, a third source, and a third drain, the third source electrically coupled to the resonating means;
 a fourth transistor means having a fourth gate, a fourth source, and a fourth drain, the fourth source being electrically coupled to the resonating means;
 a band control means electrically coupled to the third drain and the fourth drain; and
 an input means electrically coupled to the third gate and the fourth gate to receive a third biasing means.

22. The apparatus of claim 21, wherein the third biasing means is configured to bias the third transistor means such that a third gate-to-source voltage remains below a third threshold voltage and to bias the fourth transistor means such that a fourth gate-to-source voltage remains below a fourth threshold voltage.

23. The apparatus of claim 21 further comprising a switching means having a switch source, a switch drain, and a switch gate, the switch gate being electrically coupled to the band control means, the switch drain being electrically coupled to the third transistor means and the resonating means, and the switch source being electrically coupled to the fourth transistor means and the resonating means.

* * * * *